United States Patent [19]

Zens

[11] Patent Number: 4,833,412
[45] Date of Patent: May 23, 1989

[54] DOUBLE TUNED CIRCUIT FOR DISTRIBUTED LUMPED CAPACITANCE OBSERVE COILS

[75] Inventor: Albert P. Zens, Fremont, Calif.

[73] Assignee: Varian Associates, Inc., Palo Alto, Calif.

[21] Appl. No.: 179,014

[22] Filed: Apr. 8, 1988

[51] Int. Cl.[4] ............................................. G01R 33/20
[52] U.S. Cl. ..................................... 324/322; 333/219
[58] Field of Search ............... 324/300, 307, 309, 316, 324/318, 322; 333/219

[56] References Cited

U.S. PATENT DOCUMENTS

| 4,446,431 | 5/1984 | McKay | 324/322 |
| 4,594,566 | 6/1986 | Maudsley | 333/219 |
| 4,641,097 | 2/1987 | Bottomley et al. | 324/318 |
| 4,641,098 | 2/1987 | Doty | 324/318 |
| 4,720,680 | 1/1988 | Nishihara et al. | 324/318 |
| 4,725,780 | 2/1988 | Yoda et al. | 324/318 |
| 4,737,715 | 4/1988 | Ikeda et al. | 324/318 |
| 4,740,751 | 4/1988 | Misio et al. | 324/318 |
| 4,752,736 | 6/1988 | Arakawa et al. | 324/318 |
| 4,755,756 | 7/1988 | Nishihara et al. | 324/322 |
| 4,757,290 | 7/1988 | Keren | 324/318 |

Primary Examiner—Michael J. Tokar
Attorney, Agent, or Firm—Stanley Z. Cole; Gerald M. Fisher; Edward H. Berkowitz

[57] ABSTRACT

An NMR probe comprises a pair of capacitively coupled inductive members forming a first circuit resonant to a relatively high rf signal and also forming a portion of a second tuned circuit resonant at a relatively low rf signal, the entire circuit balanced to define a virtual ground in said circuit portions and relative isolation of low and high frequency sources achieved with transmission line elements.

4 Claims, 4 Drawing Sheets

DOUBLE TUNED CIRCUIT FOR DISTRIBUTED LUMPED CAPACITANCE OBSERVE COILS

FIELD OF THE INVENTION

The invention is related to RF probe circuits in the context of nuclear magnetic resonance apparatus and more particularly, with such apparatus requiring a double tuned probe.

BACKGROUND OF THE INVENTION

A double tuned circuit is one which exhibits a resonant condition for at-least two discrete frequencies. In the field of nuclear magnetic resonance (NMR) instruments, the need for such arrangement is experienced in diverse circumstances. One such circumstance is presented where it is desired to irradiate a sample at a high frequency for one purpose while concurrently irradiating the sample at a relatively low frequency for another purpose. This is typical of a decoupling experiment, an example of which is the decoupling of carbon 13—hydrogen bonds while separately exciting the carbon 13 resonance.

A variation of such an arrangement is the concurrent excitation or observation of chemically distinct samples where one such sample is a control for instrumental purposes, as in establishing a field frequency lock, while the second sample is under examination. An example of this may be found in U.S. Pat. No. 3,434,043. A similar circumstance is the desire to concurrently excite selected different nuclei for acquisition of corresponding spectral response.

A double tuned circuit ordinarily utilizes a single inductor common to two resonant circuits. Each circuit in such an arrangement is separately tuned and impedance matched to its respective RF source (or sink). What is necessary for this arrangement is an isolation element between the high frequency and low frequency sources. Double tuned circuits are known which employ a cable of length $\lambda/4$ (at the high frequency) to provide such isolation. See, for example, Stoll, Vega and Vaughan, Rev. Sci. Inst., V. 48, pp. 800–803 (1977). Balanced circuits exhibiting electrical (e.g., RF) symmetry are also known for the purpose of supporting double tuned apparatus. Such circuits, among other properties, exhibit the virtue that a symmetry plane (or other surface) is defined which has a property of electrical neutrality, e.g., a virtual ground.

Inductive elements in RF probe circuits are known to include 'split inductors' such as taught in the work of Alderman and Grant, J. Mag. Res., V. 36, pp. 447–451 (1979).

BRIEF DESCRIPTION OF THE DRAWINGS

FIG. 3b shows a frequency response simulation for the circuit of FIG. 3a.

DETAILED DESCRIPTION OF THE INVENTION

Figure 1:
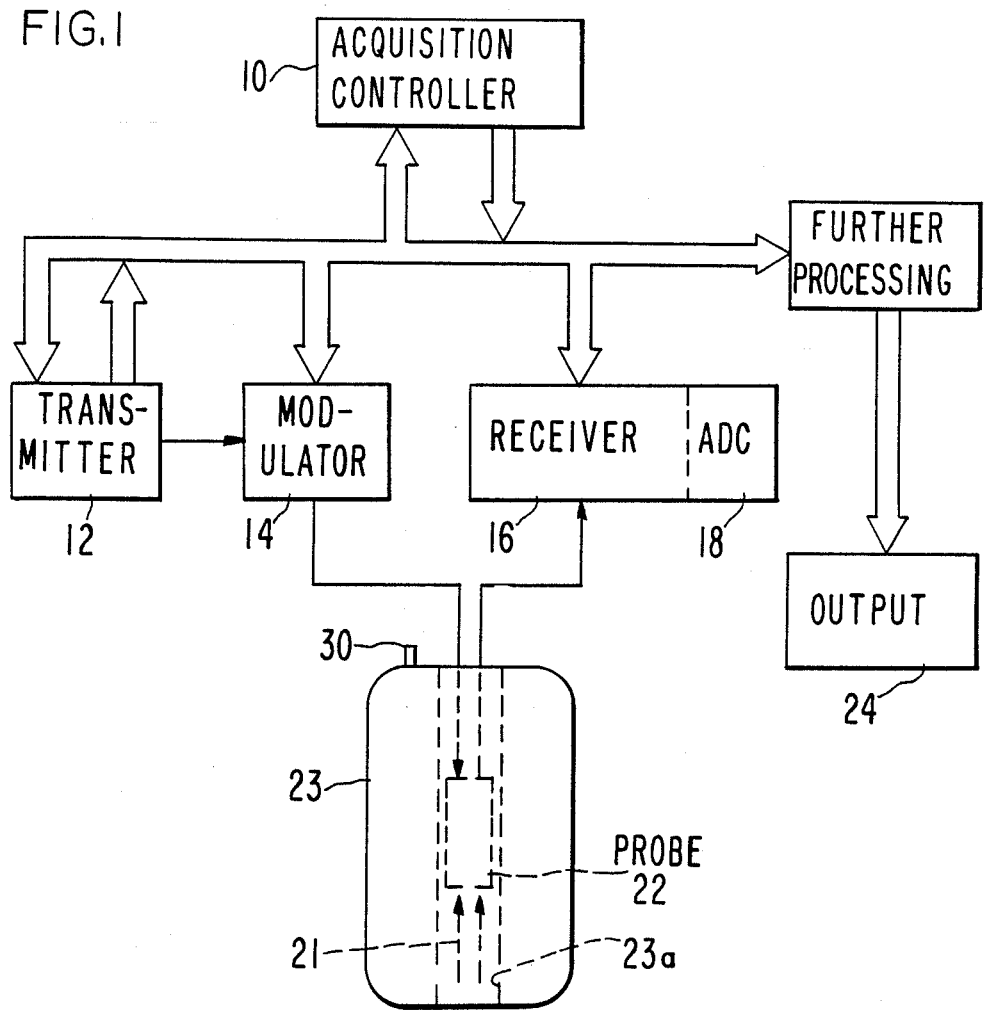
FIG. 1 shows the general context of a system embodying this invention.

Portions of a typical NMR data acquisition instrument are schematically illustrated on FIG. 1. An acquisition/control processor 10 communicates with an RF transmitter 12, modulator 14 and receiver 16, including analog-to-digital converter 18 and a further processor 20. The modulated RF power irradiates an object (not shown) in a magnetic field 21 through a probe assembly 22 and the response of the object is intercepted by probe 22 communicating with receiver 16. The response typically takes the form of a transient oscillatory signal, or free induction decay. This transient waveform is sampled at regular intervals and samples are digitized in ADC 18. The digitized time domain waveform is then subject to further processing in processor 20. The nature of such processing may include averaging a time domain waveform with a number of similar such waveforms, and transformation of the average time domain waveform to the frequency domain yields a spectral distribution function directed to output device 24. The latter may take on any of a number of identities for the display of further analysis and data.

The magnetic field 21 which polarizes the sample is established by an appropriate means indicated in FIG. 1 in a cryostat 23 for maintaining a superconducting phase in a solenoid, not shown. The cryostat comprises a bore 23a in which the probe and sample are housed at room temperature.

Figure 2:
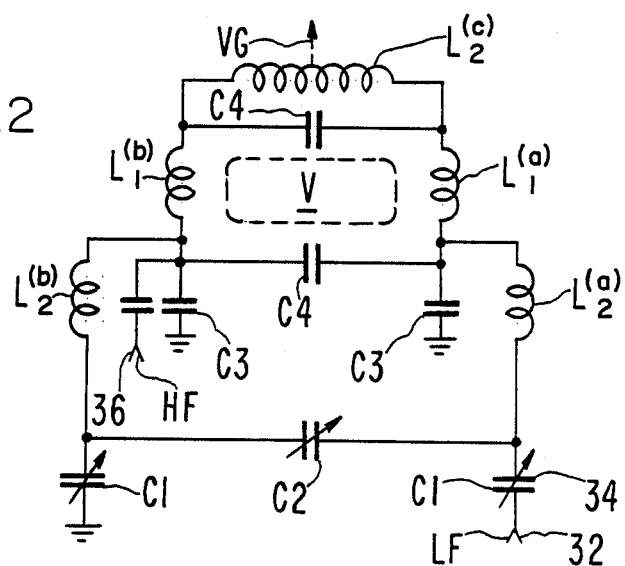
FIG. 2 shows a circuit generally describing the invention.

Turning now to FIG. 2 there is shown a circuit representative of a double tuned, balanced, split inductance RF probe suitable for experiments requiring the double tuned property in a sample volume V defined in a geometric sense between the inductances $L_1^{(a)}$ and $L_1^{(b)}$. The circuit arrangement permits the low frequency RF applied at 32 to circulate through $L_2^{(a)}$ thence over the loop comprising $L_1^{(b)}$, $L_2^{(c)}$, $L_1^{(a)}$ and $L_2^{(b)}$ to ground. Concurrently, high frequency RF is applied at 36 and propagates in the inductive loop $L_1^{(a)}$ and $L_1^{(b)}$ and the inductance $L_2$ represents parallel current paths.

Physical implementations of this circuit are subject to constraint in certain apparatus. For example, in NMR analytic instruments the probe is housed typically within the bore of a superconducting magnet. An inductor $L_2^{(c)}$ for trapping the low frequency RF presents problems in minimizing the coupling of such a trap coil to the inductance $L_1$ and $L_1^{(b)}$. There is an advantage in realizing the trap inductance in distributed form as a (substantially) $\lambda/4$ cable. The balanced nature of the circuit is emphasized by virtual ground VG.

Figure 3A:
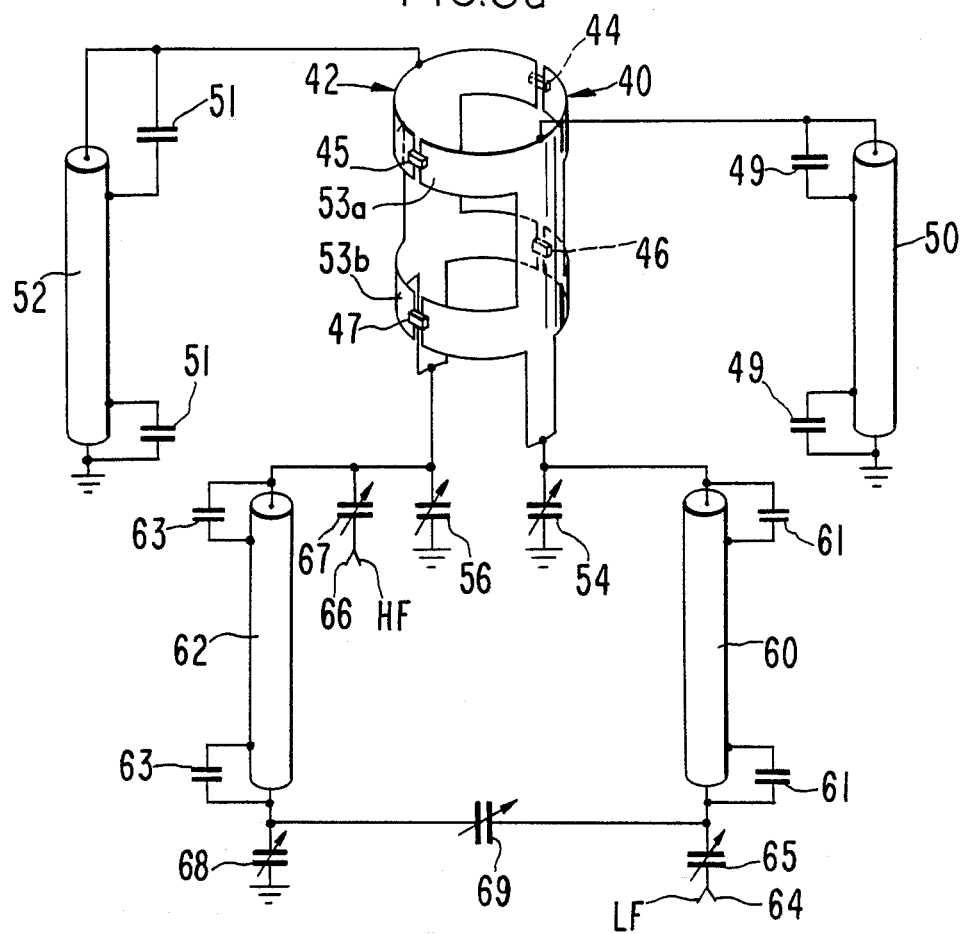
FIG. 3a shows one embodiment of the invention.

Turning now to FIG. 3a there is shown a preferred embodiment for realizing the desired circuit. A pair of H shaped conductors 40 and 42 are arranged with arms and legs and configured to form a body of cylindrical symmetry. The central portion of the H shaped member is parallel with the axis of symmetry. The corresponding arms are electrically connected by chip capacitors 44 and 45 and the adjacent legs are similarly joined by chip capacitors 46 and 47. The H shaped conductors 40 and 42 form a pair of inductive elements (implementing inductors $L_1^{(a)}$ and $L_1^{(b)}$) and the coupling coefficient of these inductors is close to unity. Each inductor is connected at one end to a resonant structure which presents a relatively high impedance to the selected high frequency. The other end of each of the H shaped members 40 and 42 are connected respectively to similar resonance structures 60 and 62 with similar properties. These implement the trap inductor $L_2^{(a)}$ and $L_2^{(b)}$. The low frequency excitation is delivered from connector 64 through matching capacitor 65 to resonator 60. Corresponding resonator 62 is coupled through capacitor 68 to ground and the resonators are capacitively coupled through variable capacitor 69. High frequency RF is applied at connector 66 through capacitor 67 to the inductive element 42 and in parallel with capacitor 56 to ground. The resonant structures 50, 52, 60 and 62 may be realized b coaxial cables of length not to exceed $\lambda/2$. Capacitances 49, 51, 61 and 65, here expressly shown, serve to tune the respective transmission lines and thus adjust the effective length of the corresponding transmission line.

Figure 3B:
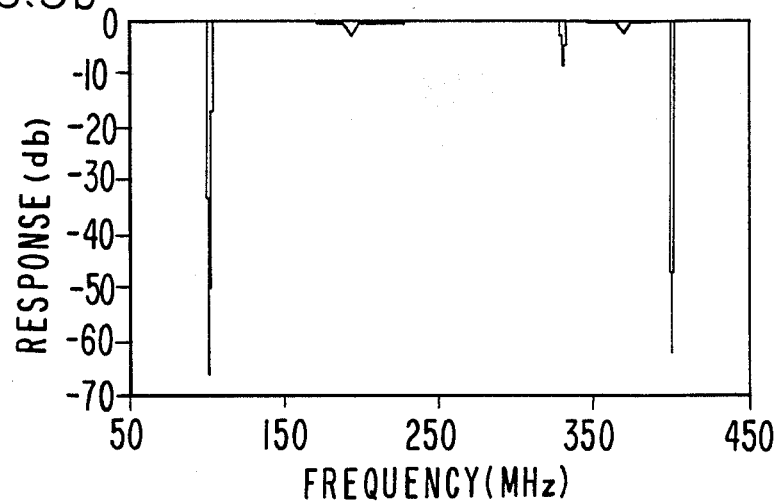

FIG. 3b shows the simulated frequency response for the circuit of FIG. 3a for the circuit components as below:

| Label | Value | Label | Value |
| --- | --- | --- | --- |
| 40 | 61 nh | 54,56 | .109 pf |
| 42 | 61 nh | 61,63 | 19.29 pf |
| 44,45,46,57 | 1.125 pf | 49,51,67 | 2.16 pf |
| 50,52 | .0625 meters | 65,68 | 3.43 pf |
| 60,62 | $Z_o = 77\Omega$ | 69 | 9.09 pf |
|  | atten: .04 db |  |  |

Several spurious resonances are found in this example. The location of such artifacts depends upon details of circuit elements. While characterized as "spurious", such artifacts reflect reactive couplings which may be analyzed as comprising additional (unbalanced) circuit loop(s) and characterized by corresponding resonant behavior. Thus, where it is desirable to obtain further discrete resonant behavior, such response may be tailored for this purpose. The circuit is balanced and is characterized by a virtual ground plane such that it is unnecessary to establish a real ground at capacitances 54 and 56 (these capacitances may be simply interconnected). The presence or absence of real ground at such points on the virtual ground symmetry axis will affect the character of the spurious resonances.

One figure of merit for performance of the double tuned probe of FIGS. 2 and 3a is to consider the high frequency current (400 MHz) circulating in the loop comprising inductors $L_1^{(a)}$ and $L_1^{(b)}$ per unit high frequency power presented at input 36 or 66. For the parameters given above, this is 839 mA/(watt)$^{\frac{1}{2}}$. A similar figure of merit for the low frequency (100 MHz) current is 1405 mA/(watt)$^{\frac{1}{2}}$. These figures are less for a double tuned circuit than can be achieved for a corresponding single tuned coil with the same inductance. Assume as a reference, a tuned coil of the same inductance with Q=400 at 400 MHz and Q proportional to the square root of frequency. The value for the corresponding figure of merit for the respective frequencies is 1142 mA/(watt)$^{\frac{1}{2}}$(at 400 MHz) and 1615 mA/(watt)$^{\frac{1}{2}}$(at 100 MHz). Thus, in comparison to the reference coil, the double tuned probe of the invention exhibits a relative efficiency of 0.734 at 400 MHz and 0.870 at 100 MHz.

A particularly useful perspective for considering the effectiveness of a probe may be gained by comparing the pulse duration required at 1 watt input to obtain a 90° mutation of a resonant nuclear spin system. For protons at 400 MHz, the reference coil requires 19.2 $\mu$sec and the subject double tuned probe requires 26.2 $\mu$sec. For $C^{13}$ at 100 MHz, the reference coil requires 54.1 $\mu$sec and the subject double tuned probe requires 62.2 $\mu$sec.

Figure 4A:
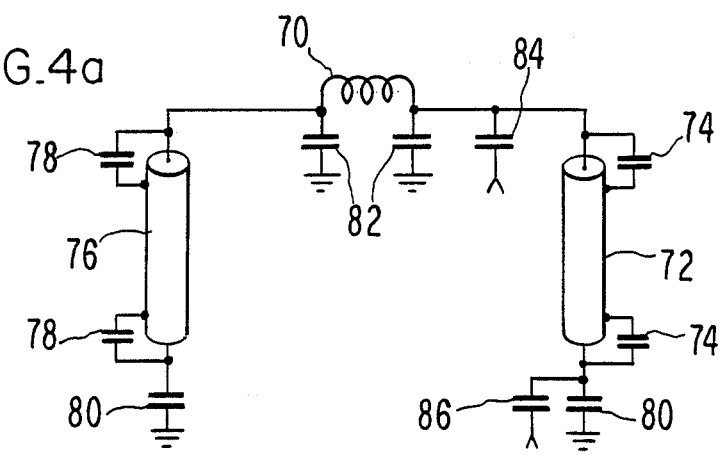
FIG. 4a shows a simple model double tuned, single inductor circuit.
Figure 4B:
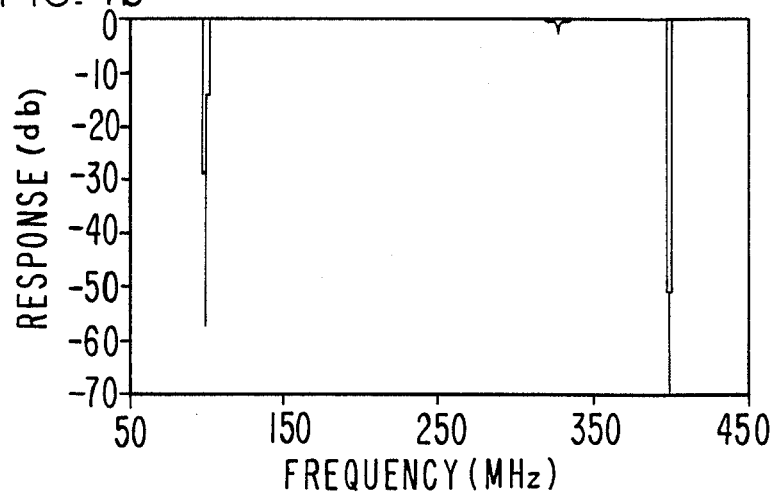
FIG. 4b shows a frequency response simulation of the FIG. 4a circuit.

A further realistic performance comparison may be had with respect to a model single inductor double tuned balanced circuit such as shown in FIG. 4a. The parameters of the model circuit are adjusted to obtain the same (simulated) performance (FIG. 4b) as obtained for the circuit of FIG. 3a. Thus the resonant frequencies are fixed and the single inductor 70 of the model circuit presents the same total inductance as the use of split inductors 40 and 42. The resonant RF impedances corresponding to resonators 60 and 62 are furnished by respective resonators 72 and 76 with corresponding tuning capacitances 74 and 78. In the preferred form of coaxial cable, the resonators 72 and 76 are necessarily twice the length as required for the performance of FIG. 3a for otherwise identical cable.

The respective circuit component values (consistent with the constraints) for the model circuit (FIG. 4a) are as below:

| Capacitances | Value |
| --- | --- |
| 80 | 24.17 Pf |
| 82 | 2.80 Pf |
| 84 | 0.48 Pf |
| 86 | 2.38 Pf |

Coaxial lines:
$Z_o = 77\Omega$; length = 0.125 M; attenuation = 0.040 db

The model may also be compared to the reference coil in the same manner as was the double tuned probe of the invention. The relative efficiency for the model at 400 MHz is 0.733 and at 100 MHz is 0.893. Thus, the double tuned probe of the invention closely approaches the performance of a model (single inductor) double tuned probe.

Figure 5:
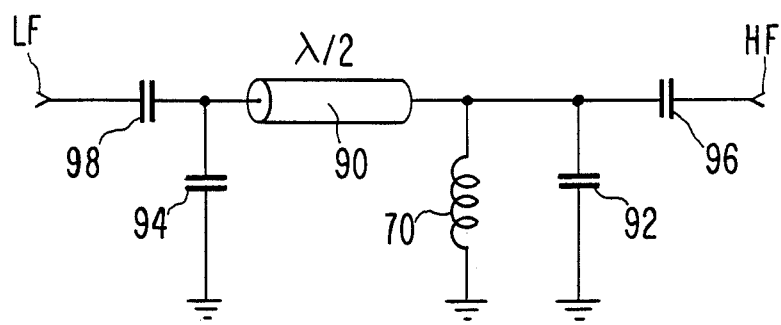
FIG. 5 is an elementary double tuned circuit.

FIG. 5 shows an elementary example of a double tuned circuit with transmission line isolation between high and low frequency channels. The tuning capacitances 92 and 94 for high frequency and low frequency channels are respectively 4.56 pf. and 27.31 pf. Matching capacitances 96 and 98 for high frequency and low frequency channels are respectively 0.63 pf. and 3.12 pf.

Figure 6:
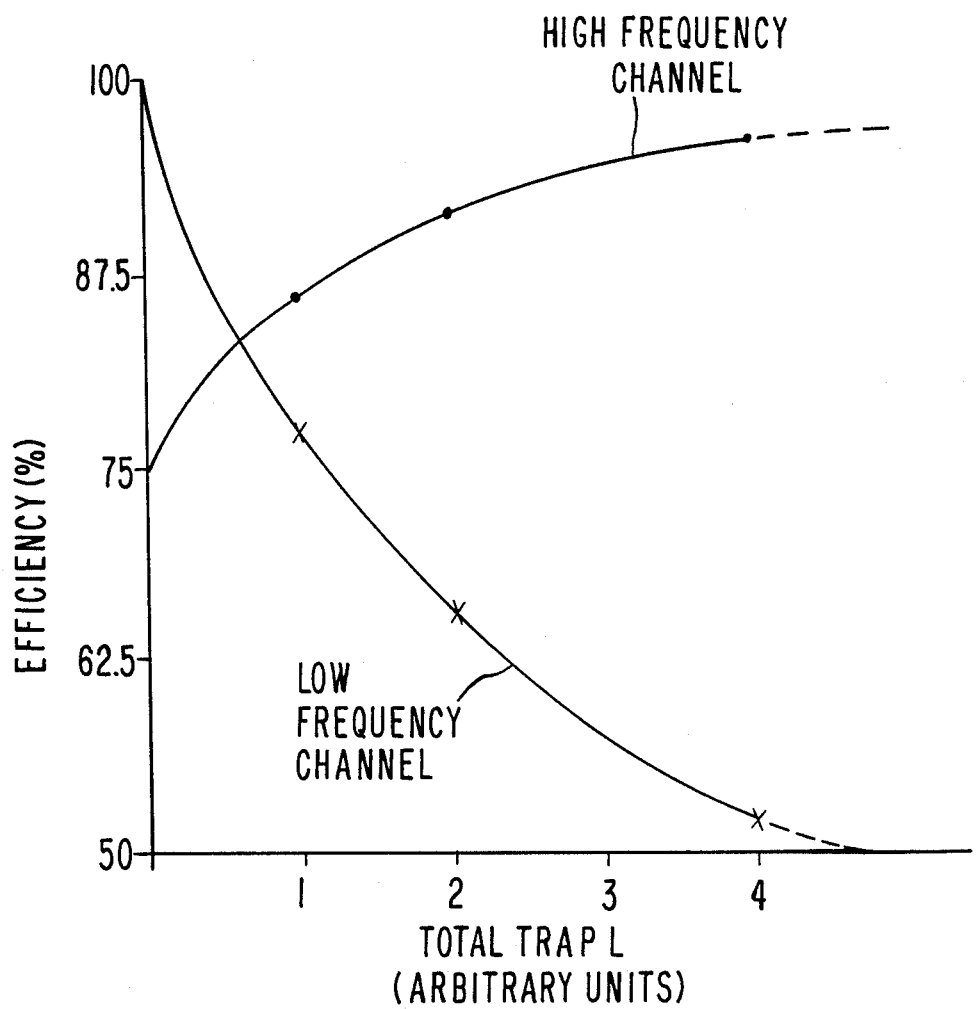
FIG. 6 compares the efficiencies of the double tuned circuits of FIGS. 3a, 4a and 5.

The comparison of the present invention with the model circuit of FIG. 4a when tuned to 200 MHz and 50 MHz and the elementary double tuned circuit of FIG. 5 when tuned to 200 MHz and 50 MHz is facilitated by examination of FIG. 6 which is calculated for circuits operating at a high frequency of 200 MHz and a low frequency of 50 MHz. The efficiency for both high and low frequency channels is shown for each of the circuits of FIGS. 3a, 4a and 5 as a function of total trap inductance. For any one of these circuits there is a practical limit to the achievable trap inductance. For coaxial elements discussed herein, this limit occurs at $\lambda/2$. (For lumped inductances, a similar limit occurs as imposed by stray capacitances between windings of the inductor.) The present invention allows the use of greater trap inductances (L=4 arbitrary units) with the result of increasing the limiting efficiency of the high frequency channel compared with FIGS. 4a and 5, albeit at the expense of the low frequency channel. However, the compromise is motivated by the need to achieve a desired higher efficiency in the high frequency channel which efficiency would not otherwise be available. The extension of the present invention to higher high frequency efficiency is achievable through additional segmentation of the inductance $L_1$, (the NMR observe coil) to a further number of segments with concomitant additional trap inductance.

In the present invention the use of shielded coaxial cables for trap inductors (50 and 52) and inductances 60 and 62 contribute two very useful mechanical design advantages. Axial symmetry is more easily preserved in an axial structure. This is a frequent choice of geometry, e.g. the symmetry axis coinciding with the polarizing magnetic field and the mechanical structural axis of the magnet. In such geometry, the implementation of FIG. 3a is advantageous because the balanced nature of the circuit permits the circuit to be physically distributed along the symmetry axis of the magnet.

Shielded coaxial cables also minimize strong inductive couplings between, for example, the trap inductances $L_2^{(c)}$ and $L_1^{(a)}$ or $L_1^{(b)}$. (See FIG. 2).

Although modifications and changes may be suggested by those skilled in the art, it is the intention of the inventor to embody within the patent all changes and modifications as reasonably and properly come within the scope of their contribution to the art.

What is claimed is:

1. A double tuned, split inductor, balanced circuit probe for NMR apparatus comprising:
    (a) at least a pair of H-shaped members configured in combination to exhibit substantially cylindrical shape, said H-shaped members each having a central portion parallel to the axis of said cylindrical shape and a pair of arm portions and a pair of leg portions, said arm and leg portions of respect H-shaped members spaced apart and communicating between adjacent leg portions and arm portions through respective capacitive elements disposed therebetween,
    (b) said arm portion connected through respective trap inductances to ground potential, said trap inductances of equal magnitude,
    (c) said leg portions connected through respective capacitances to ground potential, said capacitances of equal magnitude,
    (d) first said leg portion further connected to a respective first inductance and thence through a respective first capacitance to ground potent said first leg portion also connected through first input capacitance to a first source of rf energy,
    (e) a second said leg portion connected to a second inductance and thence through a second capacitance to a second source of rf energy, said first and second inductances are of equal value, said first and second capacitances are of equal value, said second source of rf energy is of lower frequency than said first source of rf energy,
    (f) a bridge capacitance connected between a point intermediate said first inductance and first capacitance to a point between said second inductance and second capacitance.

2. The probe of claim 1 wherein each said capacitive element comprises a series connected pair of equal value capacitors and the common connection therebetween is connected to ground potential.

3. The probe of claim 1 wherein said trap inductances comprise a distributed inductance forming a transmission line of substantially quarter wavelength at said higher frequency.

4. The probe of claims 1 or 3 wherein said first and second inductances each comprise distributed inductance forming a transmission line of substantially quarter wavelength at said higher frequency.

* * * * *